United States Patent [19]

Harris, Jr.

[11] Patent Number: 4,853,273

[45] Date of Patent: Aug. 1, 1989

[54] DRILL BOARD AND METHOD OF MAKING THE SAME

[75] Inventor: Earl C. Harris, Jr., Guilford, Conn.

[73] Assignee: Elmatco Products, Incorporated, Hamden, Conn.

[21] Appl. No.: 136,746

[22] Filed: Dec. 21, 1987

[51] Int. Cl.⁴ .......................... B32B 3/12; B32B 31/00
[52] U.S. Cl. ...................................... 428/116; 428/181; 428/184; 428/211; 428/901; 156/226; 156/227
[58] Field of Search ................ 156/226, 227; 428/116, 428/211, 901, 111, 184

[56] References Cited

U.S. PATENT DOCUMENTS

| | | | |
|---|---|---|---|
| 1,507,372 | 2/1924 | Greenstreet | 428/181 |
| 3,653,382 | 4/1972 | Easley et al. | 428/181 |
| 3,700,341 | 10/1972 | Block | |
| 3,990,936 | 11/1976 | Geschwender | 428/116 |
| 4,012,307 | 3/1977 | Phillips | 204/192 E |
| 4,269,549 | 5/1981 | Block | |

FOREIGN PATENT DOCUMENTS 253979  6/1926  United Kingdom .

Primary Examiner—Ellis P. Robinson
Assistant Examiner—P. J. Ryan
Attorney, Agent, or Firm—Robert H. Montgomery

[57] ABSTRACT

A backup board for use when drilling through a circuit board having a conductive layer therein, the backup board comprises a lamination of outer planar sheets, and an inner core of a double wall corrugated material, the outer sheets being impregnated with a thermosetting adhesive, the sheets and the core being subjected to heat and pressure to form a laminate where said corrugations fold over and bond to said outer planar sheets, to provide a backup board giving surface support by said outer sheets with a less rigid core therebetween.

8 Claims, 1 Drawing Sheet

DRILL BOARD AND METHOD OF MAKING THE SAME

FIELD OF THE INVENTION

This invention relates to backup boards to be used in the drilling of printed circuit boards.

BACKGROUND OF THE INVENTION

Printed circuit boards construction consists of one or more layers of an electrically conductive material, usually copper, mounted on or separated by one or more layers of dielectric material, generally a mixture of fiberglass scrim and epoxy resin. Holes are drilled through the conductive layer or layers and the drilled printed circuit board is plated. The copper is etched away in selective areas, leaving a series of electrical connections between the holes and providing the basic circuitry of the printed circuit board. The nature of the printed circuit board construction, which is dictated by end use requirements, generates a number of the problem areas that arise in high speed drilling. As an example, the fiberglass scrim in the dielectric areas of the assembly can cause drill-deflection and a consequent lack of accuracy in hole position. The epoxy resin of the dielectric can be a source of epoxy smear. Some of these problems can be avoided through quality control of the basic printed circuit board materials. Others can be eliminated or greatly reduced in severity through the use of drill boards.

Today drill diameters for printed circuit boards may range from a No. 97 drill of 0.004 inch diameter to a size F drill of 0.2570 inch diameter. These drills rotate in spindles at speeds that can range from 20,000 to 120,000 RPM.

Certain kinds of problems are inherent in high speed drilling of printed circuit boards. Proper use of drill boards, both entry and backup, can eliminate or minimize these problems to acceptable limits. One such problem is surface burrs. No drilling process is completely free of burring. However, high levels of flatness and hardness of drill boards reduce burring to degrees that are acceptable for many applications. The pressure of drill entry and withdrawal at high speeds can sometimes create copper delamination on the hole wall pullaway. The flatness and hardness of drill boards, both entry and backup, can essentially eliminate these problems. Additionally, the high speed drilling at or near the limits being current commercially achieved is hard on drills. Use of properly designed drill boards can extend the drill life.

Another set of problems results in hole contamination in printed circuit boards, arising from several different sources. The first problem is phenolic smear. This condition occurs when the phenolic resin used in the preparation of a drill board is insufficiently cured. The heat generated by the drill causes a partly cured phenolic to flow. As the drill is withdrawn from the hole, the fluid phenolic clinging to the drill edges is smeared to the inside of the hole surface. This requires that any drill boards utilizing a resin have to be fully cured and that there is no partly cured resin remaining to flow, regardless of the heat generated.

Another type of hole contamination is epoxy smear, which is generated in much the same fashion as the phenolic smear described above, except for the fact that the sources of material used in the preparation of the dielectric layer of the printed circuit boards, and here again, improper curing is the problem.

In the drilling of printed circuit boards to provide apertures necessary for passing component leads therethrough and for attaching the boards in place, problems have been encountered in that burrs are produced on the periphery of the aperture where the drill exits from the copper clad surface. Such a burr is unacceptable in view of the fact that it forms a hindrance to through hole plating which can entrap contaminents, which may result in cracking of the through hole plating and subsequent electrical failure. Such burrs must be removed, either by a separate sanding operation or prevented by the use of a suitable backup board.

Backup boards are disclosed in U.S. Pat. Nos. 4,269,549 and 3,700,341. The latter mentioned patent employs a core of hard pressed wood which is covered with outer layers of metallic foil. The backup board of the first mentioned patent utilizes a core of a sinusoidal material which is stated to provide cooling air passages through the board. A backup board for drilling printed circuit boards should be so constructed that it does not permit pull back of material to contaminate the printed circuit board. Moreover, a backup board should provide a high degree of surface support for the printed circuit board resting on top thereof, and should provide a good degree of surface hardness as well as providing a core which permits the drills to terminate in a forgiving substrate.

Accordingly, the present invention provides a new and improved backup board for drilling printed circuit boards.

SUMMARY OF THE INVENTION

Briefly stated, the invention in one form thereof comprises a backup board of selected materials which are laminated under heat and pressure to provide a board with a good surface hardness, which provides a high degree of surface support of the outer laminations for a printed circuit board placed thereon.

The laminated backup board has a unique core leading to less powder or dusting than standard hardboard or phenolic core materials, incorporating the benefits of a large reduction in material weight and resulting in no contamination around the hole wall and small debris in the drilling area.

The surfaces of the backup board of the present invention, in one form thereof, comprises outer sheets which are resin impregnated, together with a double wall corrugated core sheet which may also be adhesive impregnated. The outer sheets and the core material are laminated under heat and pressure and the corrugations of the core fold over upon themselves to form a fluted core which is less dense than the outer sheets.

In another form of the invention, two outer sheets may be utilized on either side to provide greater surface support and surface hardness, all of which contributes to better support and flatness of the backup drill board for the printed circuit board. If desired, the outer sheets may be metallic, such as aluminum. The indicated construction allows better panel confirmation, together with surface hardness, to eliminate exit burrs as the drill leaves the backup board and the printed circuit board.

The lower density core resulting from practice of the invention equates to far less abrasion than standard hard core materials, allowing the drills to run cooler by means of evacuating less material per revolution as the drills enter and exit the backup board.

An object of this invention is to provide a new and improved backup board for use in drilling holes in printed circuit boards.

A further object of this invention is to provide a new and improved method of making drill boards.

The features of the invention which are believed to be novel are particularly pointed out and distinctly claimed in the concluding portion of the specification. The invention, however, together with further objects and advantages thereof, may best be appreciated by reference to the following detailed description taken in conjunction with the drawings.

DETAILED DESCRIPTION OF THE ILLUSTRATED EMBODIMENT

Figure 1:
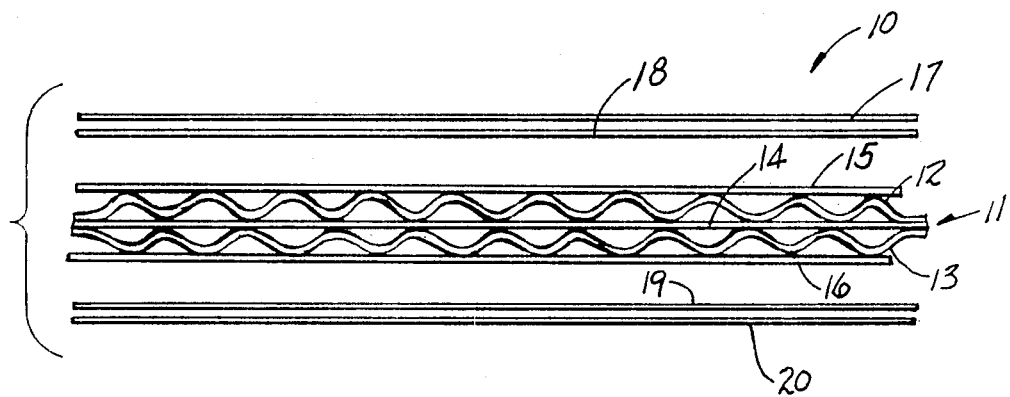
FIG. 1 is a side elevational view of the elements forming a lamination of a drill board embodying the invention.

FIG. 1 illustrates the components of a drill board 10 embodying the invention. The drill board has a core 11 of double wall corrugated sheet of Kraft type paper, with corrugations 12 and 13 bonded to a central planar sheet 14, all of Kraft paper, and outer sheets 15 and 16 bonded to the corrugations 12 and 13, respectively. This double wall corrugated sheet may or may not be impregnated with a thermosetting phenolic resin. The top layer of the board 10 is formed by two sheets of Kraft paper 17 and 18, each impregnated with a thermosetting resin. The bottom of the drill board is formed of two sheets of Kraft paper 19 and 20. The sheets 17-20 are resin impregnated Kraft paper of a thickness of approximately 0.019 inches. Two sheets are utilized for reasons hereinafter described.

Figure 2:
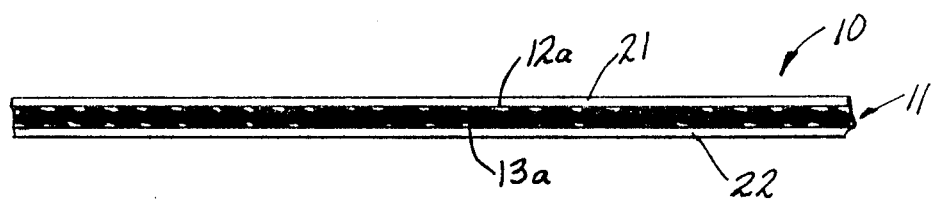
FIG. 2 is a side elevational view of the elements of FIG. 1 after lamination.

In manufacture, the sheets 17 and 18 and 19 and 20, together with the double wall corrugated core 11, may be passed through laminating rollers (not shown), which exert a pressure of two hundred to eight hundred p.s.i. and a temperature of 150 degrees to 300 degrees fahrenheit. In this process known as continuous lamination, the resin impregnated sheets are previously heated to partially activate the thermosetting resin. This heat and pressure is sufficient to laminate the sheets 17 and 18 to each other, as well as to sheet 15 and also the sheets 19 and 20 to each other and to sheet 16. The laminating pressure causes the corrugations 12 and 13 to fold over on themselves, as shown in FIG. 2. It has been found that the individual corrugations of the walls 12 and 13 will fold in the same direction when subjected to the laminating pressure. However, the corrugations of corrugated wall 12 may fold in the opposite direction than those of corrugated wall 13, and vice versa. The laminating pressure causes the corrugations to fold over, as previously mentioned, and the laminating heat is sufficient to completely cure the impregnated resin and cause the outer sheets to bond to each other and to the sheets 15 and 16. The corrugations 12 and 13 are fully compressed and folded over on one another.

In the original state, the corrugations 12 and 13 are bonded to the sheets 14, 15, and 16 at the apexes. This bond is maintained during lamination, abut the open areas are closed as the corrugations fold over.

In the alternative, the structure may be laminated under heat and pressure in a large press to form a large sheet and then the large sheet is cut to specified sizes. The resulting structure presents a drill board of high surface hardness, at least partially due to the resin impregnated in the sheets 17-20.

In the preferred form, two sheets 17, 18, and 19, 20, are utilized on each side of the core 11. However, only one thicker sheet may be utilized. It has been found that the use of two sheets provides greater surface support. This essentially eliminates burring as the drill leaves the printed circuit board and enters the backup board 10. When laminated, the two sheets 17 and 18 appear as one sheet 21 and the two sheets 19 and 20 appear as one sheet 22. The thermosetting resin contributes to surface hardness and surface support.

The resulting flatness of the board 10 does not permit the board to flex under pressure of the drill and leave a void for burrs to form as the drill exits a printed circuit board.

In some instances, the outer sheets 17 and 20 may be a foil, usually of aluminum, which are laminated to the sheets 18 and 19, respectively.

The purpose of the aluminum foil laminated to the drill board is to provide a heat sink for absorbing and dissipating heat through the addition of a metal mass into the system. The advantage of this construction is a matter of controversy among experts at the present time, and there are various arguments pro and con with respect to this approach to drill heat reduction. Where an aluminum foil is utilized, it is generally on the order of 0.002 inch. This construction utilizing the aluminum foil will also contribute to a high degree of hardness and a high degree of surface support to the outer laminations.

In high speed drilling operations of printed circuit boards, the drills penetrate the backup board about 0.050 inch or 1.27 millimeters and terminate downward movement in the main forgiving material of the core. Therefore, the dimension of the double wall corrugated sheet is so chosen that when compressed as previously described, it will still be thick enough to accept this depth from either side.

In the laminating process, all of the laminations on each side of the double walled laminated sheet will fold over and bond to the sheets 18 and 19. However, due to the nature of the materials, there may not be complete bonding of the sheets 18 and 19 to the total area of the folds of the corrugations, and thus there may be random voids as indicated by the reference numerals 12a and 13a in FIG. 2. Such voids do not run entirely through the sheet and may occur randomly throughout the finally laminated sheet. The folded over and collapsed corrugations 12 and 13, together with the center sheet 11, provide a forgiving substrate for termination of an entering drill; and this substrate does not permit pull back of material into the hole drilled through the printed circuit board, which would contaminate the walls of the hole. The low density core provides for less abrasion than the usual hard core materials, which permits the drills to run cooler since the drill has to evacuate less material per revolution.

Figure 3:
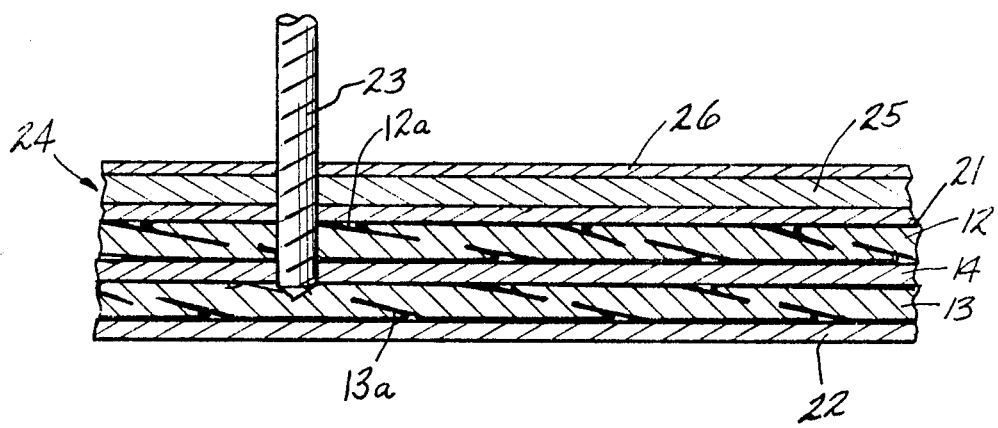
FIG. 3 is a greatly enlarged side sectional elevation of a printed circuit board on a backup board embodying the invention, and further illustrating a drill passing through the circuit board and entering the backup board.

FIG. 3 is a greatly enlarged view of a section through the board 10 of FIG. 2 and showing a drill bit 23 entering into the backup board 10 through a printed circuit board 24 comprising a dielectric core 25 with a conductive copper layer 26 thereon. As exemplified, the drill bit 23 has penetrated through the printed circuit board through the top layer 21 formed by sheets 17 and 18 into the core formed by the double wall corrugated sheet 11. The drill bit 23 terminates in the forgiving substrate formed by the double wall corrugations. Thus the drill board may be reversed and reused for further drilling operations. The sheets 17 and 18 bond into a single sheet 21 and the sheets 19 and 20 bond into a single sheet 22, as shown in FIG. 2.

The compression of the double wall corrugated sheet and simultaneous and resulting bonding of the corrugations thereof to the outer sheets 21 and 22 provides a yielding and forgiving substrate in which the drill bit terminates. However, it provides sufficient strength, together with the resin impregnated outer sheets, to provide a high degree of surface support of the outer laminations, and therefore, a high degree of surface support for the printed circuit board during drilling operations.

In drilling operations of printed circuit boards, an entry board may also be provided on the upper surface of the printed circuit board, however, for simplicity of illustration, no such entry board is shown in FIG. 3.

It may thus be seen that the objects of the invention set forth, as well as those made apparent from the foregoing description, are efficiently attained. While preferred embodiments of the invention have been set forth for purposes of disclosure, modifications to the disclosed embodiments of the invention, as well as other embodiments thereof, may occur to those skilled in the art. Accordingly, the appended claims are intended to cover all embodiments of the invention and modifications to the disclosed embodiments which do not depart form the spirit and scope of the invention.

Having thus described the invention, what is claimed is:

1. A backup board having high surface hardness for use when drilling through a circuit board having an electrically conductive layer thereon, said backup board comprising a lamination of outer planar sheets, and an inner core of a double wall corrugated material, said double wall corrugated material having outer planar sheets, a central planar sheet and corrugated paper between each of said outer sheets and said central sheet, said outer sheets being impregnated with a thermosetting adhesive, said sheets and said core being subjected to heat and pressure to form a laminate where said thermosetting adhesive bonds said outer sheets to the outer sheets of said double wall corrugated material, said corrugations fold over to provide a backup board giving surface support by said outer sheets with a less rigid core therebetween.

2. The backup board of claim 1 where said core also is impregnated with a heat sensitive material.

3. The backup board of claim 1 where said outer sheet comprises two adhesive impregnated sheets.

4. The backup board of claim 1 where said outer sheet have a layer of a metallic foil thereon.

5. The backup board of claim 1 where said adhesive is a thermosetting resin.

6. A method of making a drill board having high surface hardness and a yielding core which comprises the steps of providing first and second outer sheets of thin sheet material impregnated with a thermosetting adhesive, providing a core material of double wall corrugated material, said double wall corrugated material having outer planar sheets, a central planar sheet and corrugated paper between each of said outer sheet and said control sheet positioning said core material between said first and second outer sheets and laminating said outer sheets and core material together under heat and pressure to cause said corrugations to fold over onto each other until said adhesive is cured and bonds said outer sheets to the outer sheets of said core.

7. The method of claim 6 where said outer sheets are each two sheets both impregnated with said thermosetting adhesive.

8. The method of claim 6 wherein said outer sheets are paper impregnated with said adhesive with an outer metallic foil adhered thereto.

* * * * *